United States Patent
Nakanishi

(10) Patent No.: US 7,921,340 B2
(45) Date of Patent: Apr. 5, 2011

(54) NONVOLATILE MEMORY DEVICE, NONVOLATILE MEMORY SYSTEM, AND DEFECT MANAGEMENT METHOD FOR NONVOLATILE MEMORY DEVICE

(75) Inventor: Masahiro Nakanishi, Kyoto (JP)

(73) Assignee: Panasonic Corporation, Osaka (JP)

( * ) Notice: Subject to any disclaimer, the term of this patent is extended or adjusted under 35 U.S.C. 154(b) by 294 days.

(21) Appl. No.: 12/160,972

(22) PCT Filed: Nov. 30, 2006

(86) PCT No.: PCT/JP2006/323919
§ 371 (c)(1),
(2), (4) Date: Oct. 10, 2008

(87) PCT Pub. No.: WO2007/083449
PCT Pub. Date: Jul. 26, 2007

(65) Prior Publication Data
US 2010/0223510 A1    Sep. 2, 2010

(30) Foreign Application Priority Data
Jan. 20, 2006 (JP) .................. 2006-012984

(51) Int. Cl.
*G11C 29/00* (2006.01)
(52) U.S. Cl. ...................... 714/718; 714/733
(58) Field of Classification Search .......... 345/214; 702/34, 184; 711/103, 173; 714/718, 721, 714/733
See application file for complete search history.

(56) References Cited

U.S. PATENT DOCUMENTS

| | | | |
|---|---|---|---|
| 5,581,469 A * | 12/1996 | Kim | 702/34 |
| 6,601,132 B2 * | 7/2003 | Nomura et al. | 711/103 |
| 6,646,931 B2 | 11/2003 | Mizoguchi et al. | |
| 6,901,498 B2 * | 5/2005 | Conley | 711/173 |
| 7,333,918 B2 * | 2/2008 | Burrill et al. | 702/184 |
| 7,595,796 B2 * | 9/2009 | Ranganathan et al. | 345/214 |
| 2003/0002366 A1 | 1/2003 | Mizoguchi et al. | |
| 2007/0214309 A1 | 9/2007 | Matsuura et al. | |
| 2008/0049504 A1 | 2/2008 | Kasahara et al. | |
| 2008/0168252 A1 | 7/2008 | Kunimune et al. | |

FOREIGN PATENT DOCUMENTS

| | | |
|---|---|---|
| JP | 7-141899 A | 6/1995 |
| JP | 2001-195316 A | 7/2001 |
| JP | 2003-085054 A | 3/2003 |

OTHER PUBLICATIONS

English language Abstract of JP 2003-085054 A.
English language Abstract of JP 7-141899 A, 1995.
English language Abstract of JP 2001-195316 A.
U.S. Appl. No. 11/814,202 to Nakanishi et al., which was filed on Jul. 18, 2007.

(Continued)

*Primary Examiner* — David Ton
(74) *Attorney, Agent, or Firm* — Greenblum & Bernstein, P.L.C.

(57) ABSTRACT

A life parameter generator generates life parameters related to the life of a nonvolatile memory device by using parameters related to allowable capacity for memory defect and occurrence capacity for memory defect. The life parameters are stored in a life parameter storing block of a nonvolatile memory. An access device reads and displays the stored life parameters. Thus, the user can precisely know the life of the nonvolatile memory device or the moment when a device having a built in nonvolatile memory such as a portable audio becomes unusable.

3 Claims, 15 Drawing Sheets

OTHER PUBLICATIONS

U.S. Appl. No. 11/722,362 to Nakanishi et al., which was filed on Jun. 21, 2007.
U.S. Appl. No. 11/817,532 to Nakanishi et al., which was filed on Aug. 31, 2007.
U.S. Appl. No. 11/908,715 to Nakanishi et al., which was filed on Sep. 14, 2007.
U.S. Appl. No. 11/993,631 to Inoue et al., which was filed on Dec. 21, 2007.

* cited by examiner

F I G. 1 B
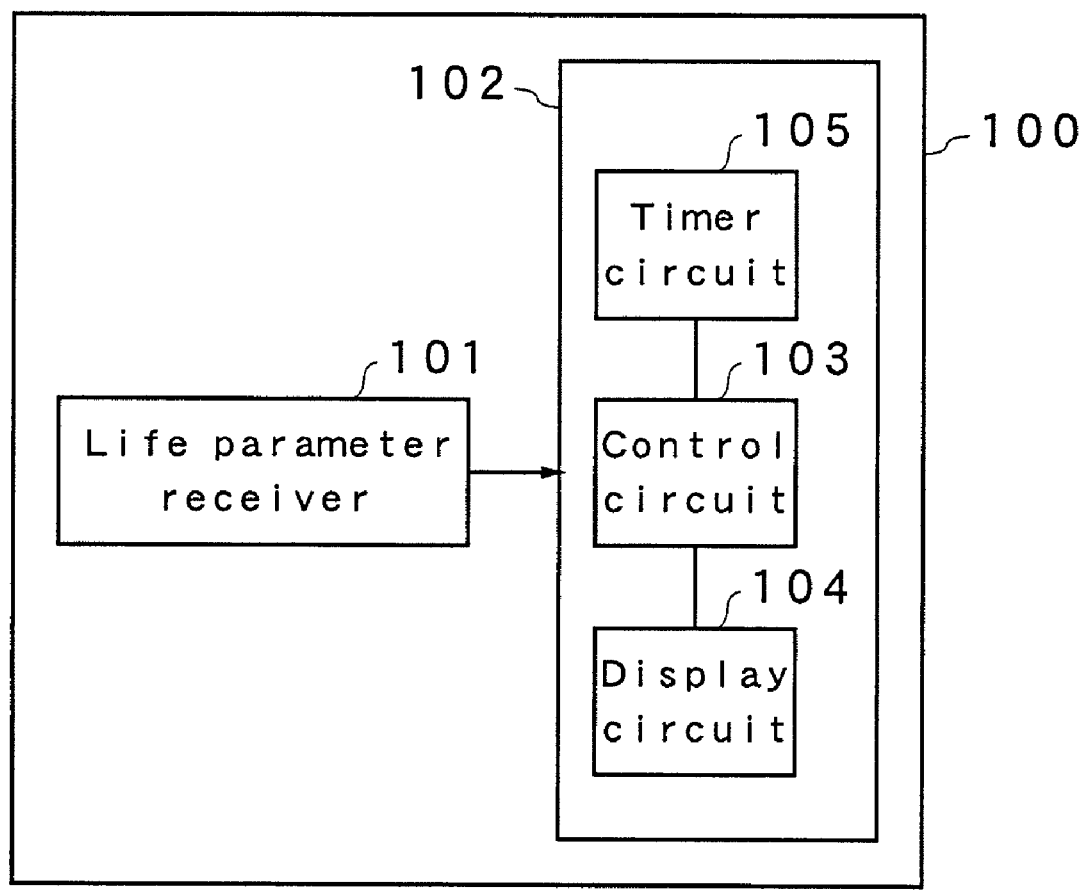

F I G. 2

| ID Code | Capacity | Physical block size | Guaranteed number of rewriting time |
|---|---|---|---|
| 0x0 | 128 Mbytes | 16 kbytes | 100000 |
| 0x1 | 256 Mbytes | 16 kbytes | 100000 |
| 0x2 | 512 Mbytes | 16 kbytes | 100000 |
| 0x3 | 1 Gbytes | 128 kbytes | 100000 |
| 0x4 | 1 Gbytes | 256 kbytes | 10000 |
| 0x5 | 2 Gbytes | 256 kbytes | 10000 |
| 0x6 | 2 Gbytes | 512 kbytes | 8000 |
| 0x7 | 4 Gbytes | 512 kbytes | 8000 |
| ⋮ | ⋮ | ⋮ | ⋮ |

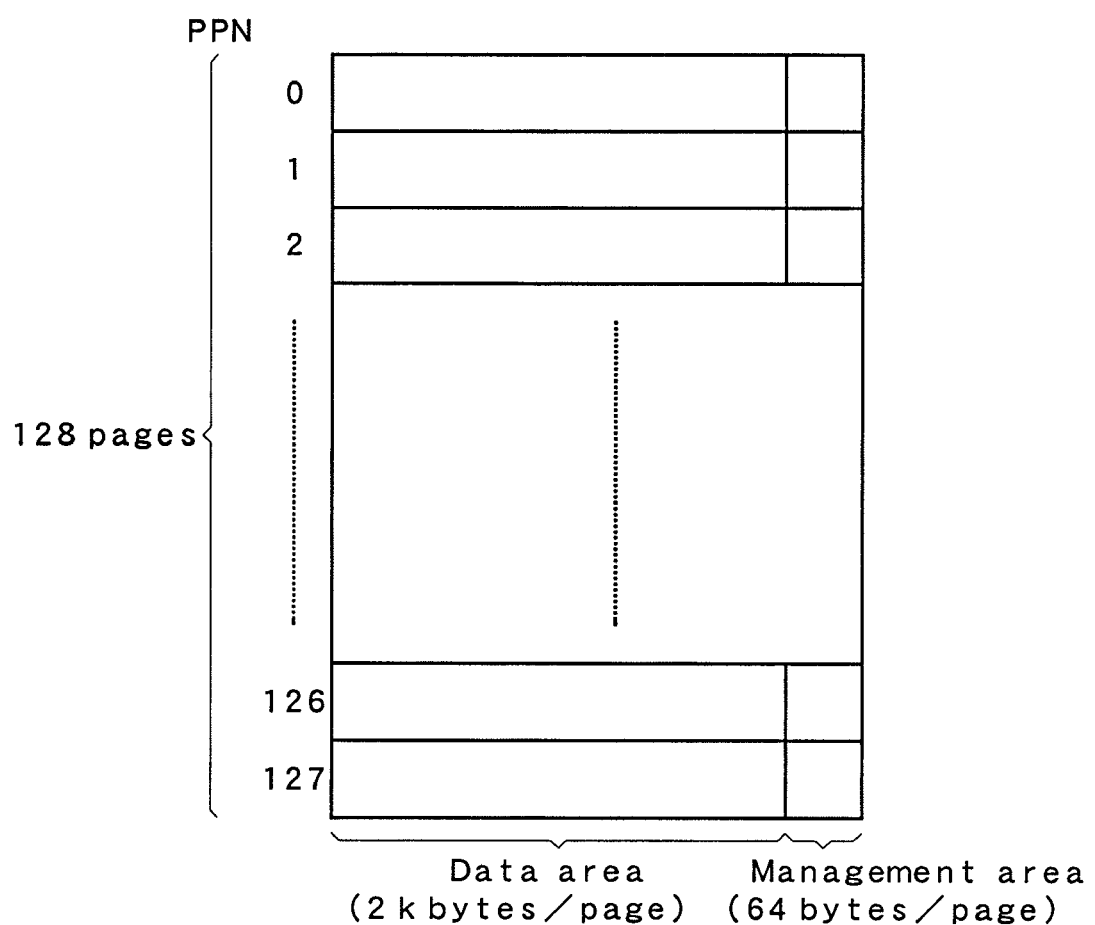
F I G. 4

PBN 0

00 : Valid block
10 : Invalid block
11 : Erased block

4095

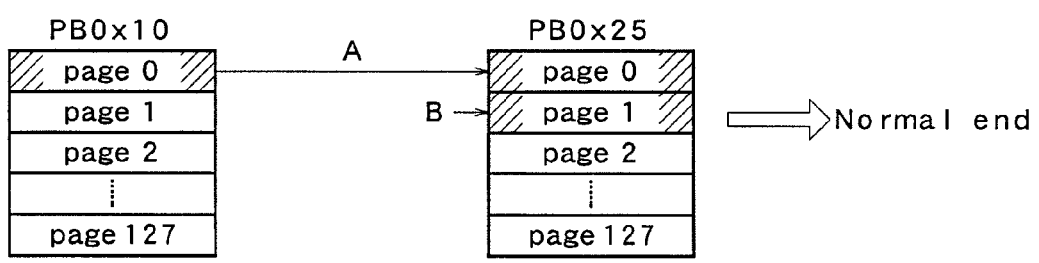
F I G. 1 0 A

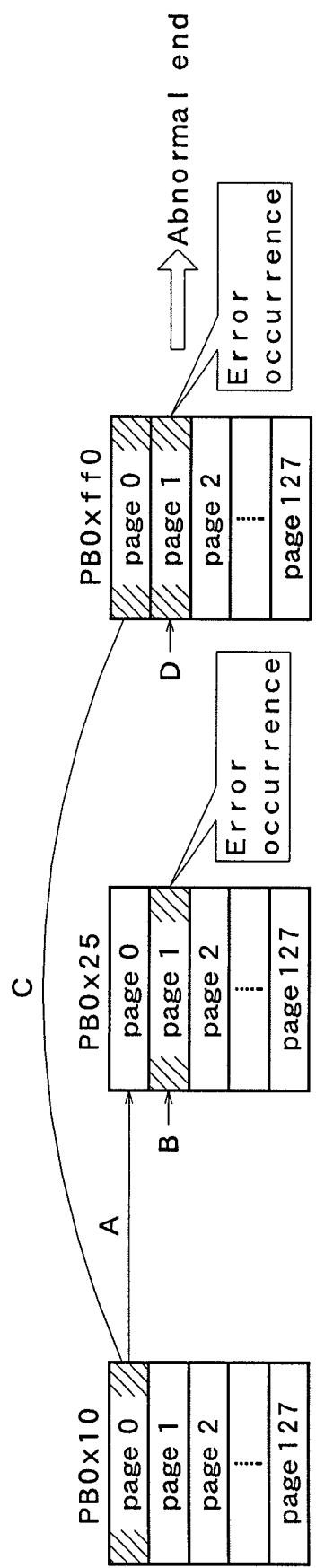

F I G. 1 2
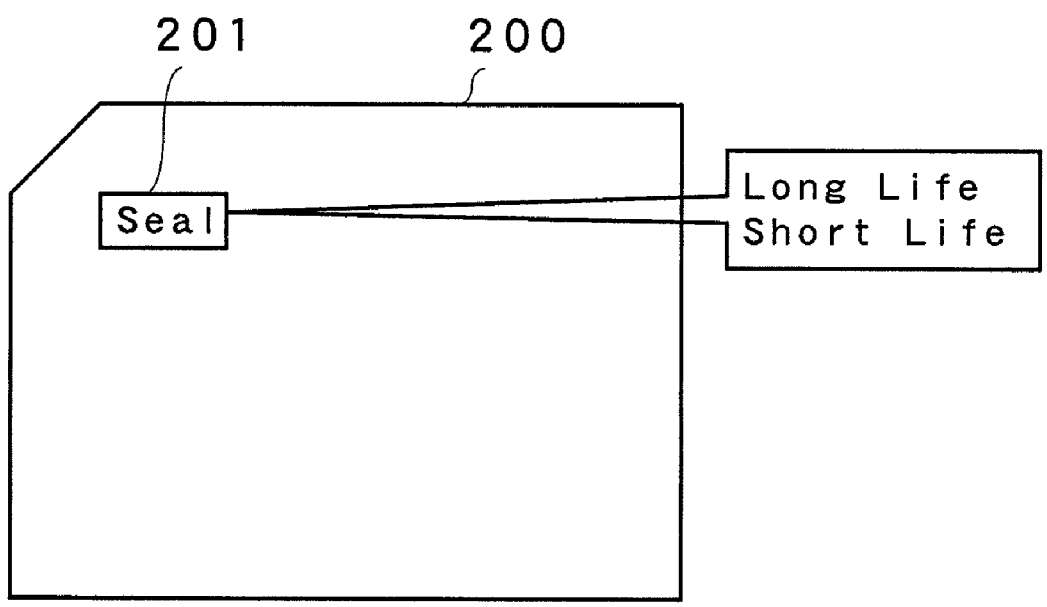

NONVOLATILE MEMORY DEVICE, NONVOLATILE MEMORY SYSTEM, AND DEFECT MANAGEMENT METHOD FOR NONVOLATILE MEMORY DEVICE

TECHNICAL FIELD

The present invention relates to a nonvolatile memory device, such as a memory card, provided with a nonvolatile memory, a nonvolatile memory system having an access device added as a component to the nonvolatile memory device, and a defect management method for nonvolatile memory device.

BACKGROUND ART

Demands for nonvolatile memory devices provided with a rewritable nonvolatile memory, mainly for semiconductor memory cards, have been growing. Although the semiconductor memory card is very high-priced as compared to an optical disc, a tape media and the like demands for semiconductor memory cards as recording media for a mobile device such as a digital still camera, a mobile phone, or the like have been growing due to its advantages such as small size, light weight, shock resistance, convenience to handle, etc. This semiconductor memory card includes a flash memory as a nonvolatile main memory, and has a memory controller for controlling it. The memory controller performs a read-write control on the flash memory in accordance with read and write instructions from an access device in a main body of the digital still camera, personal computer, or the like. Moreover, there are not only some portable audio apparatuses using the semiconductor memory card as a memory device but also some portable audio apparatus installing a flash memory in the main body of the portable audio apparatuses. In recent years, the semiconductor memory card is not only used for consumer's application but also used in a professional moving image recorder in a broadcast station etc.

A flash memory installed in products such as the semiconductor memory card, portable audio apparatus, and the like requires relatively long time for writing and erasing to a memory array as a recording unit, and thus is so structured to be capable of collectively erasing and writing data to a plurality of memory cells. The memory card is composed of a plurality of physical blocks, each of which includes a plurality of pages. The erasing is performed in units of physical blocks, and the writing is performed in units of pages.

In response to demands for larger capacity and lower cost, predominating is flash memories, such as a multi-level NAND flash memory, of the type that are capable of storing information of two bits in one memory cell. Such a multi-level NAND flash memory has difficulties in ensuring the reliability of a memory cell and thus has a low guaranteed number of times of rewriting. The guaranteed number of rewriting is 100,000 for a conventional single-level NAND flash memory for example, but it decreases to one tenth, namely 10,000 for the multi-level NAND flash memory described above for example. Moreover, it also becomes difficult to manufacture a flash memory that can guarantee 10,000 times of rewriting.

The guaranteed number of times of rewriting in a flash memory is directly linked to the life of a semiconductor memory card and to the life of a device such as a portable audio apparatus itself. Conventionally, users who use the semiconductor memory card and an apparatus such as the portable audio apparatus have assumed the lives of these apparatuses to be semipermanent. However, when using a product loaded with the flash memory whose guaranteed number of times of rewriting is limited, it is important especially for users who frequently rewrite data to use it with consideration given to the life or to select a product while keeping the product life in mind.

To deal with this problem, as shown in Patent Documents 1 and 2 for example, a nonvolatile memory system which permits the user to recognize the life of a memory has been conventionally proposed. According to these documents, the user can recognize a rough life of the nonvolatile memory by displaying the rewriting number of times in a nonvolatile memory having a finite life to the user.

Patent Document 1: Japanese Unexamined Patent Publication No. Hei07-141899

Patent Document 2: Japanese Unexamined Patent Publication No. 2001-195316

DISCLOSURE OF THE INVENTION

Problems to be Solved by the Invention

However, in the conventional technique described above, the guaranteed rewriting number in the nonvolatile memory is just a guaranteed value and thus not a feasible value. The feasible value greatly differs among different flash memories; thus, the user cannot recognize the real life. For example, some nonvolatile memories can feasibly withstand 100,000 times of rewriting although their guaranteed number of times of rewriting is 10,000. For such nonvolatile memories, the user cannot judge the real life even when the rewriting number is displayed to the user. In addition, the life also varies depending on the architecture of a memory controller; thus, the real life of a nonvolatile memory device cannot be judged only based on the number of times of rewriting. For example, when a sufficient spare area used as an alternative block is ensured in the event of memory defect occurs, the life is relatively long. Moreover, a nonvolatile memory device with which wear leveling by logical-physical conversion has been performed has a longer life than that of a device with which the wear leveling has not been performed.

Further, when the number of times of rewriting in the nonvolatile memory is notified to the user, the user needs to previously recognize the guaranteed number of times of rewriting in the nonvolatile memory and to check the guaranteed number of times.

Such a problem is remarkably observed in a system, such as a professional moving image recorder, which records data for commercial use. In other words, for the professional moving image recorder using a memory card as a recording medium, it is important to accurately recognize the life of the memory card and replace it when it reaches the end of its life. For example, in a nonvolatile memory device including a flash memory whose guaranteed number of times of rewriting is 10,000 and having a capacity of 4 GB, when recording is performed every day for two hours at a recording rate of 25 Mbytes/second, rewriting for an entire area of 4 GB occurs approximately 44 times based on formula (1):

$$(2\times 3600 \text{ seconds/day}) \div (4 \text{ GB} \div 25 \text{ MB/second}) = \text{approximately 44 times/day} \qquad (1).$$

Therefore, it can be estimated that the life of the semiconductor memory card expires in approximately 227 days based on formula (2):

$$10,000 \text{ times} \div 44 \text{ times/day} = \text{approximately 227 days} \qquad (2).$$

However, it is inconvenient to reliably manage hours of use per day and days of use, and also the feasible number of times of rewiring, namely, the possible number of times of rewriting differs among different nonvolatile memories. In such circumstances, it is unlikely to replace a high-priced semiconductor memory card based on only the rough estimation.

Thus, in view of the problem described above, the present invention intends to permit the user to accurately and easily recognize when a device having a semiconductor memory card or a nonvolatile memory installed therein can no longer be used.

Means to Solve the Problems

To solve the problems, a nonvolatile memory device according to the present invention which reads and writes data in accordance with commands for an access from outside, comprises: a nonvolatile memory; a life parameter generator for generating a life parameter related to a life of said nonvolatile memory device; and a life parameter output part for outputting said life parameter to the outside.

Said life parameter generator may generate the life parameter based on at least an occurrence capacity for memory defect of said nonvolatile memory.

Said nonvolatile memory may include a plurality of physical blocks, and said capacity may be in units of the number of physical blocks of said nonvolatile memory.

Said life parameter generator generates the life parameter by at least one of: generating two parameters including allowable capacity for memory defect of said nonvolatile memory and the occurrence capacity for memory defect of said nonvolatile memory; generating a parameter related to a ratio of the occurrence capacity for memory defect of said nonvolatile memory with respect to the allowable capacity for memory defect of said nonvolatile memory; generating an estimated remaining time parameter for the life of said nonvolatile memory device; generating alert information showing that an end of the life of said nonvolatile memory device is approaching; generating a parameter related to a ratio of the occurrence capacity for memory defect with respect to entire capacity of said nonvolatile memory; and generating a parameter related to a remaining capacity for allowing memory defect.

Said nonvolatile memory may include a plurality of physical blocks, and said capacity may be in units of the number of physical blocks of said nonvolatile memory.

Said nonvolatile memory device may display the life thereof by external appearance thereof.

To solve the problems, a nonvolatile memory system according to the present invention includes an access device and a nonvolatile memory device which reads and writes data in accordance with commands for an access from said access device, wherein said nonvolatile memory device comprises: a nonvolatile memory; a life parameter generator for generating a life parameter related to the life of said nonvolatile memory device; and a life parameter output part for outputting said life parameter to the outside, and wherein said access device comprises: a life parameter receiver for receiving parameters from said life nonvolatile memory device; and a display part for displaying the life parameter received by said life parameter receiver.

Said life parameter generator may generate the life parameter based on at least an occurrence capacity for memory defect of said nonvolatile memory.

Said nonvolatile memory may include a plurality of physical blocks, and said capacity may be in units of the number of physical blocks of said nonvolatile memory.

Said life parameter generator may generate the life parameter by at least one of: generating two parameters including allowable capacity for memory defect of said nonvolatile memory and occurrence capacity for memory defect of said nonvolatile memory; generating a parameter related to a ratio of the occurrence capacity for memory defect of said nonvolatile memory with respect to the allowable capacity for memory defect of said nonvolatile memory; generating an estimated remaining time parameter for the life of said nonvolatile memory device; generating alert information showing that an end of the life of said nonvolatile memory device is approaching; generating a parameter related to a ratio of the occurrence capacity for memory defect with respect to entire capacity of said nonvolatile memory; and generating a parameter related to a remaining capacity for allowing the memory defect.

Said nonvolatile memory may include a plurality of physical blocks, and said capacity may be in units of the number of physical blocks of said nonvolatile memory.

Said nonvolatile memory device may indicate whether a life of the nonvolatile memory device is long or short by its outer appearance.

To solve the problems, a defect management method for a nonvolatile memory device according to the present invention having a nonvolatile memory comprises steps of: generating a life parameter related to a life of said nonvolatile memory device; and outputting said life parameter.

A generation step for the life parameter of said nonvolatile memory device may generate the life parameter based on at least an occurrence capacity for memory defect of said nonvolatile memory.

Said nonvolatile memory may include a plurality of physical blocks, and said capacity may be in units of the number of physical blocks of said nonvolatile memory.

The generation step for the life parameter of said nonvolatile memory device may generate the life parameter by at least one of: generating two parameters including allowable capacity for memory defect of said nonvolatile memory and the occurrence capacity for memory defect of said nonvolatile memory; generating a parameter related to a ratio of the occurrence capacity for memory defect of said nonvolatile memory with respect to the allowable capacity for memory defect of said nonvolatile memory; generating an estimated remaining time parameter for the life of said nonvolatile memory device; generating alert information showing that an end of the life of said nonvolatile memory device is approaching; generating a parameter related to a ratio of the occurrence capacity for memory defect with respect to entire capacity of said nonvolatile memory; and generating a parameter related to a remaining capacity for allowing memory defect.

Said nonvolatile memory may include a plurality of physical blocks, and said capacity may be in units of the number of physical blocks of said nonvolatile memory.

EFFECTIVENESS OF THE INVENTION

According to the present invention, since the nonvolatile memory device generates and holds the life parameters related to the life and further outputs, the life of the nonvolatile memory device can be judged based on past records of actual memory defect occurrence. Namely, since the user can accurately and easily recognize the life of the nonvolatile memory device, the user can use the nonvolatile memory device without anxiety. When the device closely comes to the life time, the user can take an action, such as using the nonvolatile memory system only for, for example, music reproduction, purchasing a new nonvolatile memory device, or backing up important data stored in the nonvolatile memory device into another recording medium.

Further, according to the inventions of claims 6 and 12, the user can judge the life thereof based on information specified in the nonvolatile memory device before purchase of the nonvolatile memory device.

BRIEF DESCRIPTION OF DRAWINGS

FIG. 1B is a block diagram showing an access device of the nonvolatile memory system according to an embodiment of the present invention.

FIG. 2 is a memory map showing a memory type table included in a parameter-1 determiner.

FIG. 4 is an explanation view showing a configuration of one physical block in detail.

FIG. 10A is an explanation view showing a case no error occurred at data writing.

FIG. 10C is an explanation view showing a case an error occurred at data writing.

FIG. 12 is an appearance diagram showing a package of the nonvolatile memory device.

EXPLANATION FOR REFERENCE NUMERALS

Figure 1A:
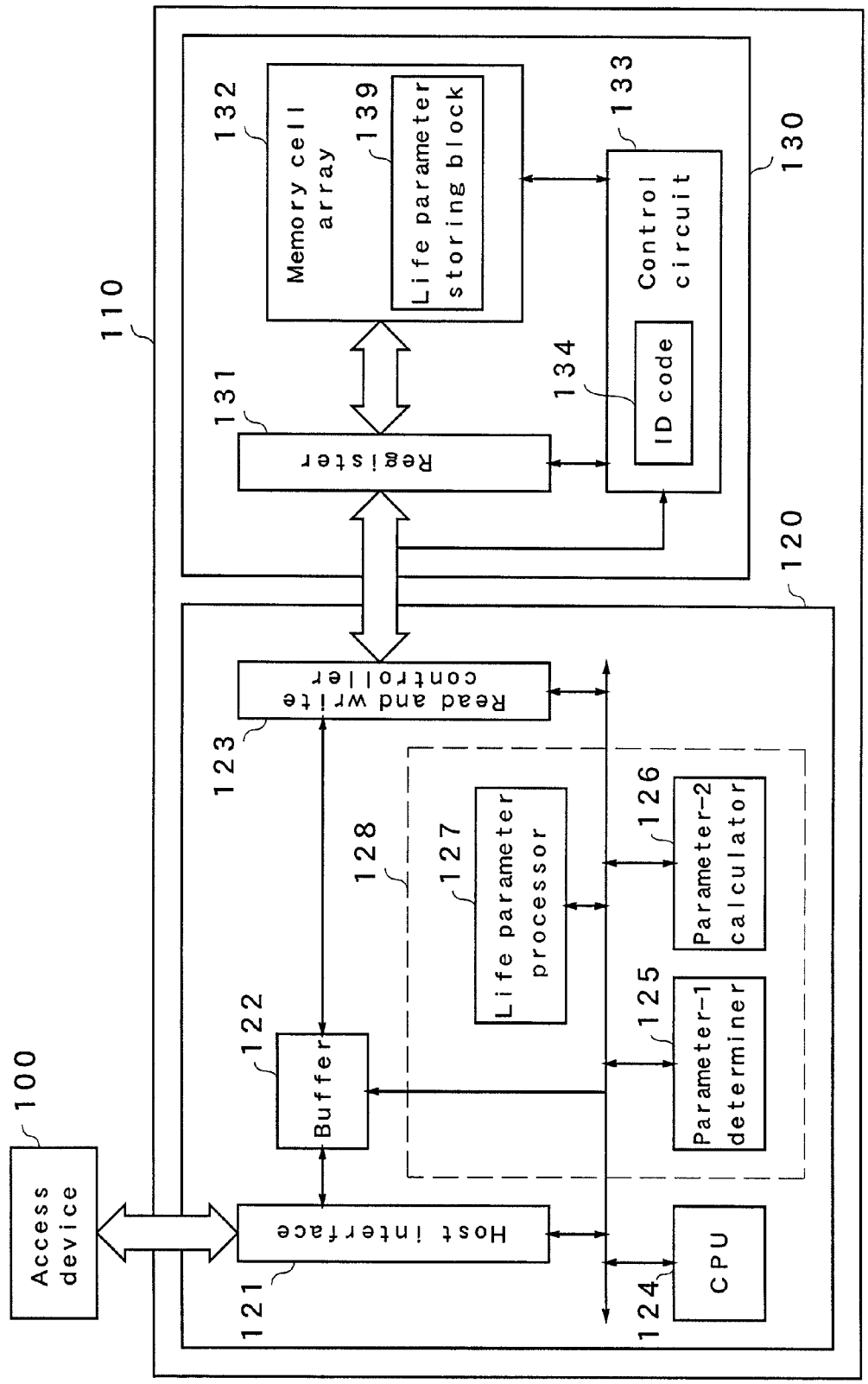
FIG. 1A is a block diagram showing a nonvolatile memory device of a nonvolatile memory system according to an embodiment of the present invention.

100 Access device
101 Life parameter receiver
102 Display part
110 Nonvolatile memory device
120 Memory controller
121 Host interface
122 Buffer
123 Read and write controller
124 CPU
125 Parameter-1 determiner
126 Parameter-2 calculator
127 Life parameter processor
128 Life parameter generator
130 Nonvolatile memory
131 Register
132 Memory cell array
133 Control circuit
134 ID code
135 Normal area
136 Register area
137 System area
138 Spare area
139 Life parameter storing block
200 Housing
201 Seal

BEST MODE FOR CARRYING OUT THE INVENTION

Embodiment

FIG. 1A is a block diagram showing a nonvolatile memory device in a nonvolatile memory system according to an embodiment of the present invention, and FIG. 1B is a block diagram showing an access device thereof. In FIGS. 1A and 1B, the nonvolatile memory system is so structured as to include an access device 100 and a nonvolatile memory device 110. The access device 100 and the nonvolatile memory device 110 are connected each other by a bus 1. The nonvolatile memory device 110 includes a memory controller 120 and a nonvolatile memory 130. The memory controller 120 and the nonvolatile memory 130 are connected each other via a bus 2.

The memory controller 120 includes a host interface 121, buffer 122, read and write controller 123, CPU 124, parameter-1 determiner 125, parameter-2 calculator 126, and life parameter processor 127. The parameter-1 determiner 125, parameter-2 calculator 126, and life parameter processor 127 are collectively provided as a life parameter generator 128.

The host interface 121 is a block which receives a command related to data writing and reading from the access device 100, logical address, and data and which also transmits data to the access device 100 at the time of data reading.

The buffer 122 is used for absorbing a difference between a transfer rate of the bus 1 and a transfer rate of the bus 2. Its size corresponds to capacity, here 4 k bytes, which is twice a size of a register 131 in the nonvolatile memory 130 to be described later.

The read and write controller 123 is a block for writing data temporarily stored in the buffer 122 into the nonvolatile memory 130 and also reading out data stored in the nonvolatile memory 130 into the buffer 122.

The CPU 124 performs overall control of the memory controller 120 and generates a physical address of the nonvolatile memory 130 based on a logical address received from the access device 100. The CPU 124 also has a function as an output part which outputs a life parameter held in a life parameter holder described later to the outside in accordance with instructions from the access device.

The parameter-1 determiner 125 is a block which refers to an ID code 134 of the nonvolatile memory 130 and determines a parameter 1 as allowable capacity for the number of defect blocks in accordance with the capacity of the nonvolatile memory 130. The parameter-1 determiner 125 includes a type information table for nonvolatile memories in a memory, such as a ROM, as shown in FIG. 2. The type information table is a table showing overall capacity, physical block sizes, and the guaranteed numbers of times of rewriting for ID codes 0x0, . . . indicating the types of nonvolatile memories. The parameter-1 determiner 125 holds the allowable number of defect blocks calculated based on this table as a parameter P1.

The parameter-2 calculator 126 is a block which counts, as a parameter P2, an accumulated value of the number of physical blocks generating an error in writing data into the nonvolatile memory 130.

The life parameter processor 127 has a timer circuit built therein and is a block which performs processing for generating first to fifth life parameters to be described later by using the parameters P1 and P2. This timer circuit constantly counts time while the power of the nonvolatile memory device 110 is on.

The nonvolatile memory 130 has a register 131, a memory array 132, and a control circuit 133. The register 131 is a volatile RAM having the same size as the size of a page as a writing unit to be described later, and temporarily stores data transferred from the read and write controller 123. The memory array 132 is a flash memory having, for example, a capacity of 1 G bytes, and includes a plurality of physical blocks.

The control circuit 133 stores the ID code 134 for identifying the nonvolatile memory 130 and also controls the register 131 and the memory array based on a write command and physical address transferred from the read and write controller 123. The ID code 134 is a code which permits the identification of the nonvolatile memory 130 and is previously stored in a ROM of the control circuit 133 or the like at the time of manufacturing the flash memory. Alternatively, the ID code 134 may be previously written in a partial area in the memory array 132.

Figure 3:
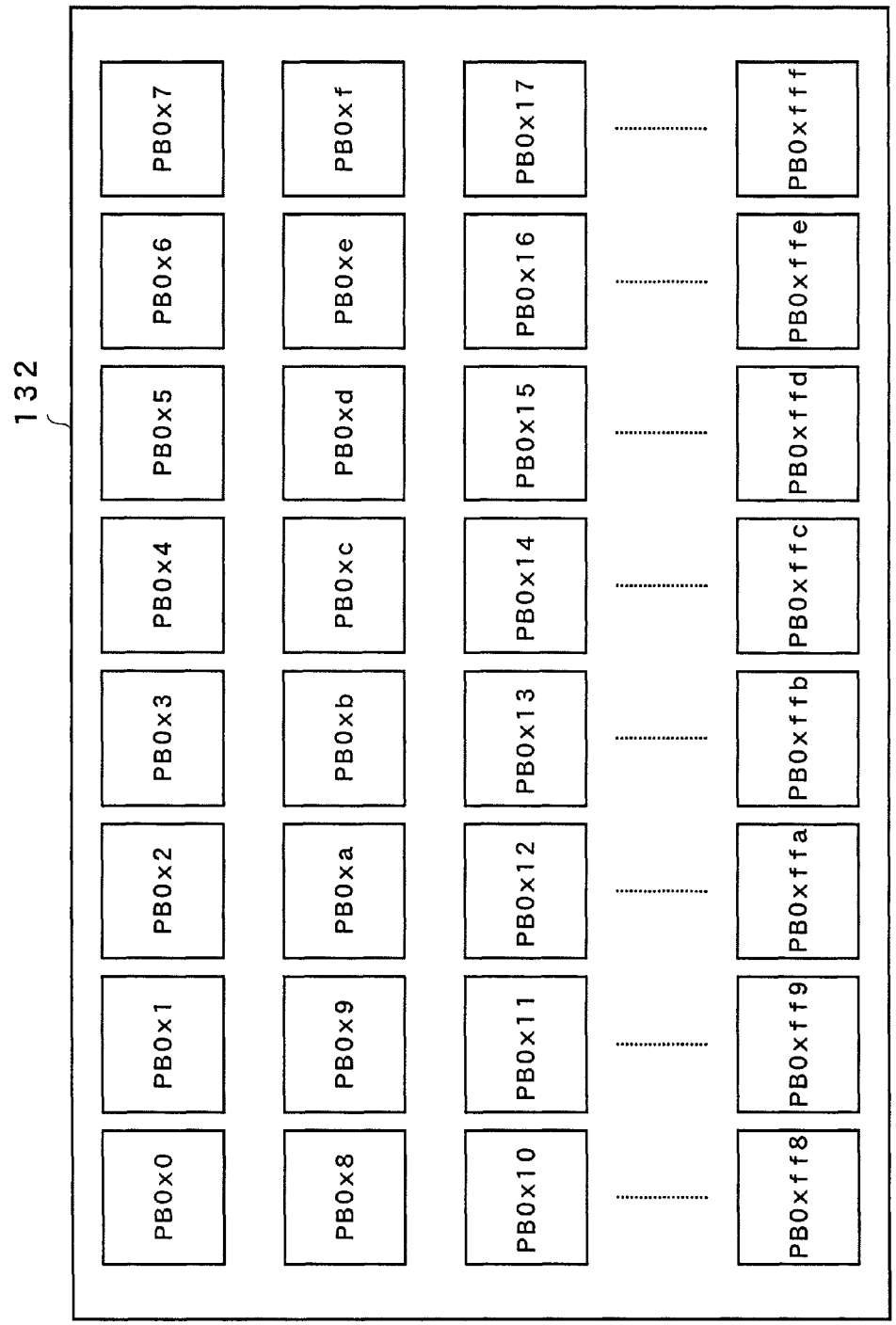
FIG. 3 is an explanation view showing a configuration of physical blocks.

FIG. 3 is a diagram showing a configuration of the memory array 132. As shown in this figure, this memory array is assumed to have a capacity of 1 GB and includes physical blocks 0 to 4095 (PB0x0 to PB0xfff, where 0x denotes a hexadecimal number). Each of the physical blocks includes 128 pages with physical page numbers PPN0 to PPN127 as shown in FIG. 4. A data area per page is assumed to be 2 k bytes. Other than the data area, each page has a management area of 64 bytes per page. The data area of each page usually stores data transferred from the access device 100. The management area stores an ECC code for error-correcting, etc. The physical block is an erase unit, and the page is a writing unit. The data area size of each physical block is 256 kbytes. The size of the register 131 is 2 k bytes in accordance with the capacity for the pages.

Figure 5:
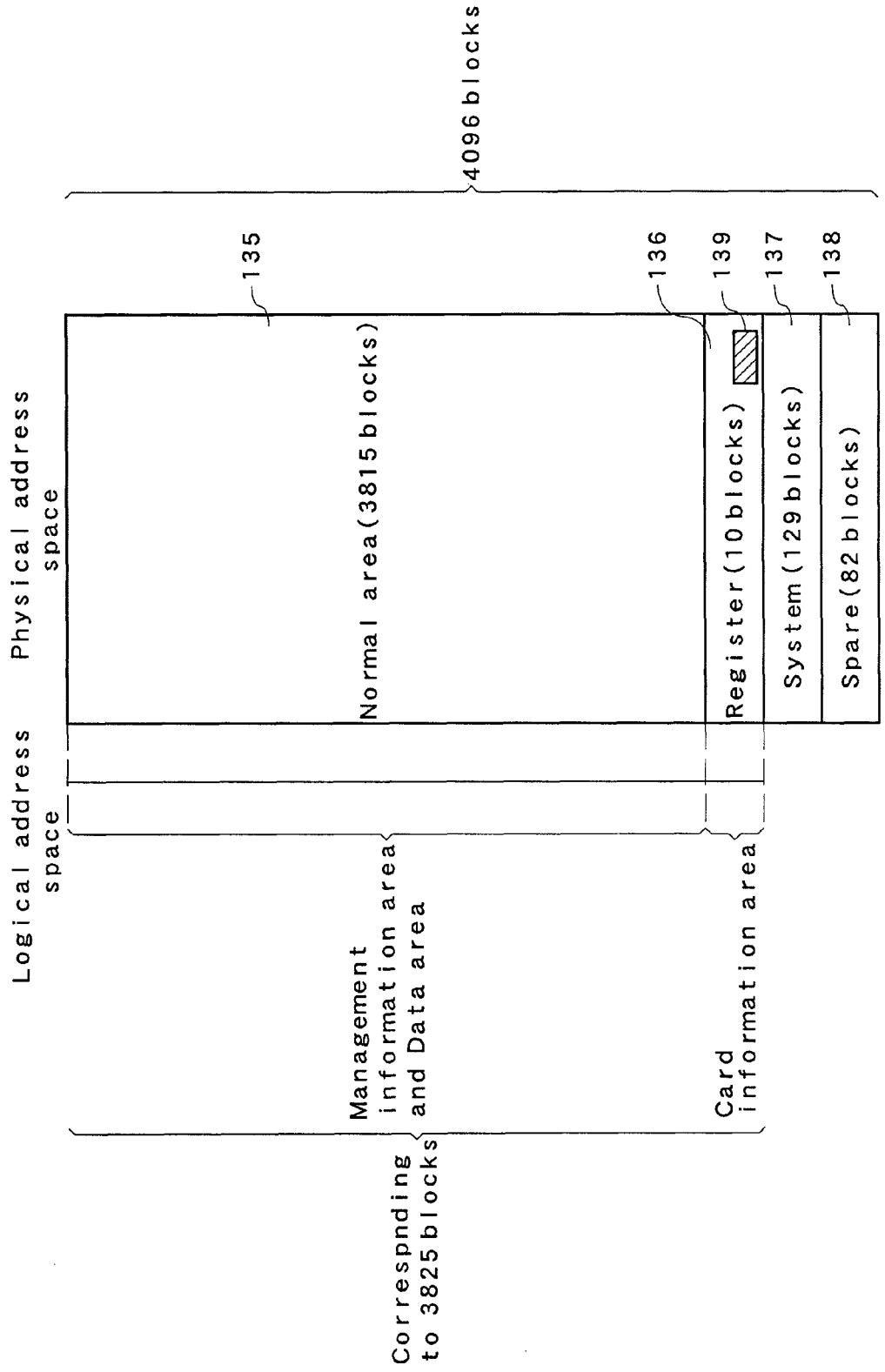
FIG. 5 is a memory map showing a relationship between a logical address space and a physical address space.

FIG. 5 is a diagram showing a memory map illustrating correspondence between a logical address space and a physical address space of the nonvolatile memory 130. Here, the physical address space includes 4096 blocks as described above, including 3815 blocks for a normal area 135, a register area 136 of 10 blocks, a system area of 129 blocks, and a spare area 138 of 82 blocks. These areas are formed by below-mentioned initialization processing. A life parameter storing block 139 is provided in the register area 136. The life parameter storing block 139 is a life parameter storage that stores life parameters to be described later.

The access device 100 is a device that performs data writing and data reading to the nonvolatile memory device 110, and internally includes a life parameter receiver 101 and display part 102. The life parameter receiver 101 is a block for reading the life parameter stored in the life parameter storing block 139. The display part 102 includes a control circuit 103, display circuit 104, and timer circuit 105. The control circuit 103 is a circuit which is connected to the timer circuit 105 and transfers a display command to the display circuit 104 and a reception command to the life parameter receiver 101. The display circuit 104 is a circuit which displays life-related information on the nonvolatile memory device 110 based on the parameters 1 and 2.

Figure 6:
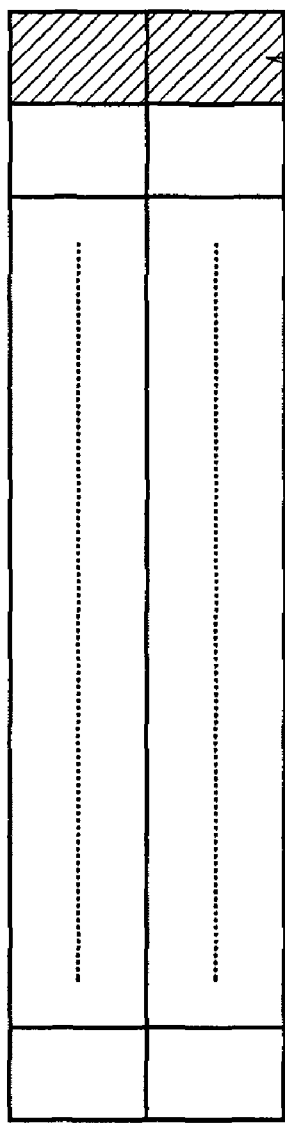
FIG. 6 is a memory map showing a physical area management table included in the CPU 124.
Figure 7:
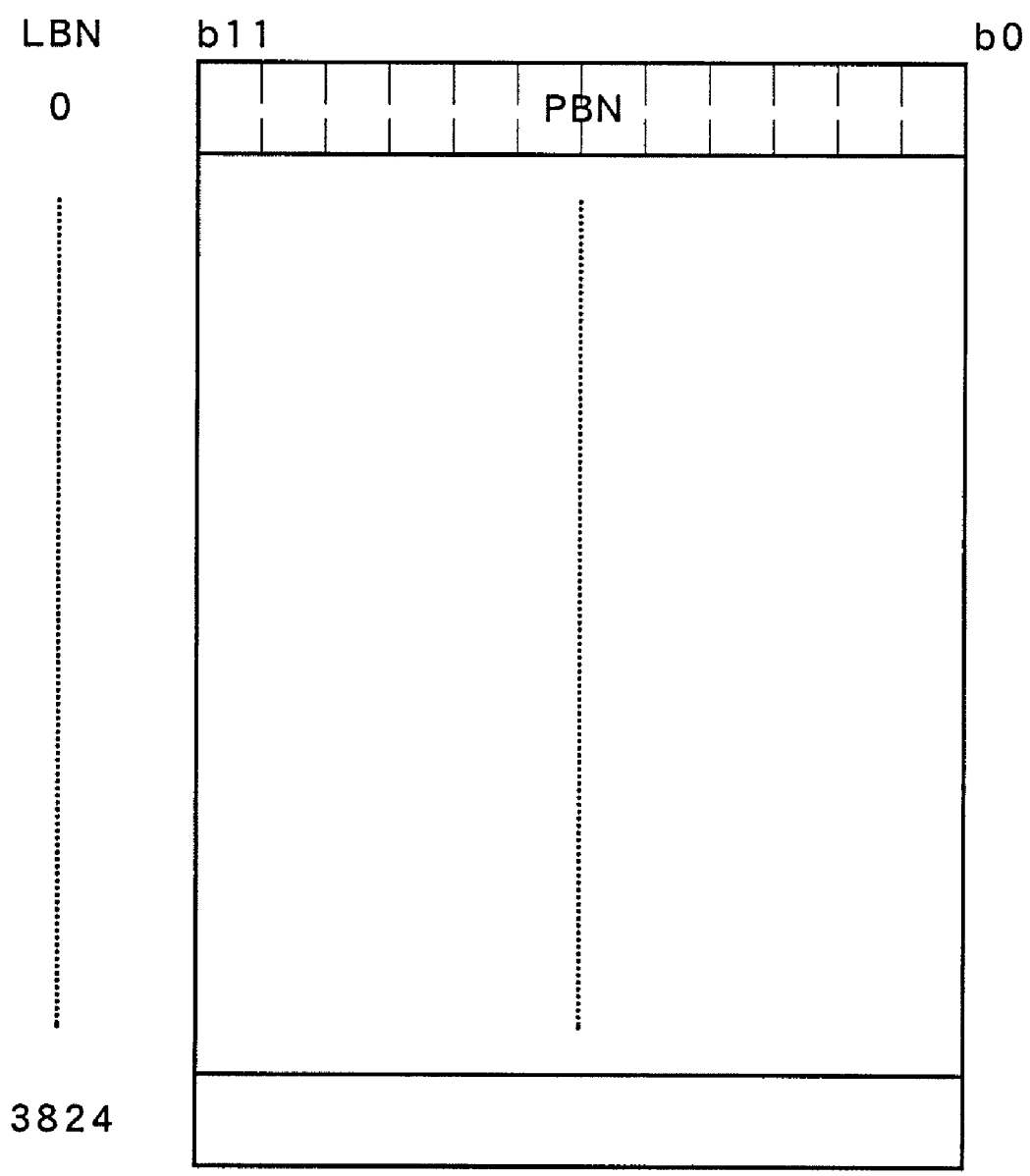
FIG. 7 is a memory map showing a logical-physical conversion table included in the CPU 124.

The CPU 124 includes a physical area management table shown in FIG. 6 and a logical-physical conversion table shown in FIG. 7. The physical area management table shows, in correspondence with each physical block number PBN, a block status of each physical block, namely, a valid block, defect block, and erased block in two bits of 00, 10, and 11, respectively. Moreover, the logical-physical conversion table is a table for converting a logical block number LBN into a physical block number PBN.

The nonvolatile memory system of the present embodiment configured as described above will be described, separately concerning an initial state, initialization processing at the time of turning the power on, and data write processing during a normal operation.

[Initial State]

First, a description will be given, concerning details of initialization processed on a semiconductor memory card vender side before shipment of the nonvolatile memory device 110.

FIG. 5 shows the correspondence between the logical address space managed by the access device 100 and the physical address space of the nonvolatile memory device 110, where the logical address space is a space narrower than the physical address space. Before the shipment of the semiconductor memory card, all areas in the nonvolatile memory 130 are previously checked for defect blocks through a rewriting test. A defect block identified at this point is called "an initial defect block", and the physical block number of the defect block is managed so that the block status of the corresponding physical number in the physical area management table of FIG. 6 can be set as a defect block in a later process.

Next, after all the areas are erased, system information such as secure information is stored into the system area 137 of FIG. 5. Further, the physical area management table (of 1 k bytes) shown in FIG. 6 and the logical-physical conversion table (of 6 k bytes) shown in FIG. 7 are stored into the physical blocks other than the defect blocks in the system area 137. The block statuses of the defect blocks are preliminarily set at a value 10 and the block statuses of the physical blocks other than the defect blocks are preliminarily set at a value 11 in the physical area management table. 0xfff is preliminarily set in each row of the logical-physical conversion table. Moreover, attribute information, for example, card capacity, etc., for the nonvolatile memory device (semiconductor memory card) is stored into the register area 136.

The sizes of the register area 136 and the system area 137 differ among different types of nonvolatile memory devices, in the present embodiment, the register area occupies ten blocks (2560 k bytes) and the system area occupies 129 blocks (33024 k bytes).

The normal area 135 is an area which stores so-called file data, such as images and music data, transmitted from the access device 100 and management information (FAT information, etc.) for managing the file data. The file data and the management information are collectively and simply referred to as data. The spare area 138 is an area secured as an alternative to a defect block when the defect block has occurred during writing into the respective areas. It is preferable for the spare area 138 to ensure a capacity larger than or equal to 2% of the entire area size. The reason for this is based on regulations on the number of times of rewriting guaranteed by a flash memory vendor. For example, if this guaranteed number of times is 10,000 times, this means that the size of defect blocks occurred by 10,000 times of rewriting accounts for less than 2% of the entire area size. In the present embodiment, 82 blocks are ensured for the spare area 138 through rounding-up processing based on formula (3):

$$(1G \text{ bytes}/256 \text{ k bytes}) \times 2\% \approx 82 \text{ block} \qquad (3).$$

However, in some types of nonvolatile memory devices, the sizes of the register area 136 and the system area 137 are relatively large, and thus the size of the spare area 138 may be smaller than 82 blocks.

Then repeating rewriting uses up the entire spare area 138, so that data recording as the nonvolatile memory device can no longer be performed. To manage this timing, the life parameter storing block 139 is provided in the last physical block of the register area 136. The life parameter storing block 139 is arranged at the last logical block number of the logical address space, namely, LBN=3824 as viewed from the access device 100. Therefore, 3824 (0xefd in a hexadecimal number) is stored as the physical block number PBN at a position where the logical block number LBN is 3824 in the logical-physical conversion table shown in FIG. 7.

Figure 8:
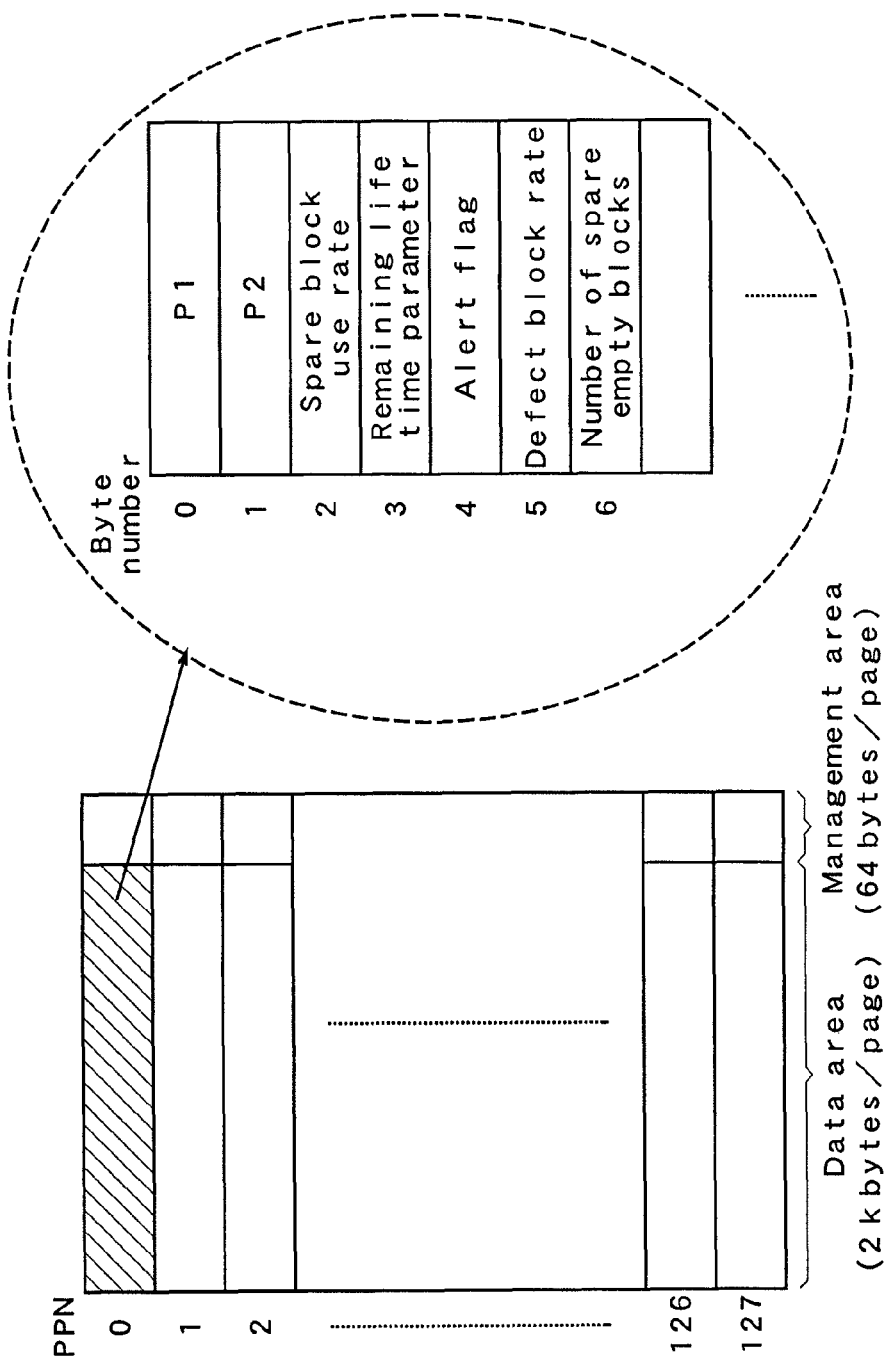
FIG. 8 is an explanation view showing a configuration of a life parameter storing block.

FIG. 8 is a diagram showing the life parameter storing block 139. This physical block stores life parameters in a physical page number 0x0. Arranged in an ascending order from lower bytes of the physical page number 0x0, namely, a byte number 0, are: the parameter P1, the parameter P2, a spare block use rate, an estimated life time parameter, an alert flag, and a defect block rate. These parameters and flag are collectively referred to as life parameters.

The parameter 1 represents the allowable capacity for defect blocks, namely, the number of physical blocks (82 blocks) in the space area. On the other hand, the parameter 2 represents the occurrence capacity for defect blocks, namely, the number of defect blocks which have occurred at the time. In the present embodiment, it is assumed that the number of defect blocks is one, for example, in an initial state. Values of the parameters P1 and P2 are stored into the byte numbers 0 and 1 of the physical page number 0 in the life parameter storing block as shown in FIG. 8.

[Initialization Processing at the Time of Turning the Power On]

As a result of turning on the power of the access device 100, the power of the nonvolatile memory device 110 is turned on through the bus 1, and the nonvolatile memory device 110 starts the initialization processing. In the initialization processing, the CPU 124 temporarily stores, in the volatile RAM inside the CPU 124, the physical area management table and the logical-physical conversion table stored in the system area 137 via the read and write controller 123. Thereafter, in data reading and writing, a physical address is determined by using these tables temporarily stored in the RAM inside the CPU 124. Every time when each of the tables is updated, the table is saved to the nonvolatile memory 130 as a measure against power-off.

Next, the parameter-1 determiner 125 reads the ID code 134 via the read and write controller 123 and refers to the memory type table shown in FIG. 2. When the ID code is 0x4 for example, the nonvolatile memory 130 is of a type that the capacity is 1 G bytes, the physical block size is 256 k bytes, and the guaranteed number of times of rewriting is 10,000. The guaranteed number of times of rewriting is not referred to in the present embodiment. The parameter-1 determiner 125 calculates the number of blocks in the spare area by executing formula (3) as 82 blocks and holds it in the parameter-1 determiner 125.

Next, the CPU 124 clears the entire buffer 122, and notifies the access device 100 via the host interface 121 that the initialization has been completed.

The parameter-2 calculator 126 refers to the physical area management table, counts the number of block statuses set at a value 10, namely, the number of defect blocks, and stores the counted value as the parameter 2 in the parameter-2 calculator 126. Note that, when the number of defect blocks is "1" immediately after the shipment as described above, the parameter P2 is set at a value 1.

The life parameter processor 127 generates the following five types of parameters as the life parameters. Although all of these five types are executed in the present embodiment, some of them may be executed.

(1) Parameters P1 and P2

A first parameter includes: the parameter P1 as the allowable capacity for memory defect of the nonvolatile memory 130, namely, the number of physical blocks in the spare area 138; and the parameter P2 as the occurrence capacity for memory defect of the nonvolatile memory 130, namely, the number of physical blocks which have actually become a defect block. The life parameter processor 127 reads the parameter P1 held in the parameter-1 determiner 125 and stores it into the byte number 0 of the physical page number 0 of the life parameter storing block 139. As described above, if the parameter P1 is stored in the life parameter storing block 139 in a process before the shipment, writing into the life parameter storing block 139 is not required. Next, the life parameter processor 127 reads the parameter P2 held in the parameter-2 calculator 126 and stores it into the byte number 1 of the physical page member 0 of the life parameter storing block 139. Namely, in the first parameter generation processing, the life parameter processor 127 performs processing of simply reading the parameter P1 and the parameter 2 from the parameter-1 determiner 125 and the parameter-2 calculator 126, respectively, and then writing them into the life parameter storing block 139.

(2) Spare Block use Rate

A second parameter represents a use rate of the number of physical blocks used in place of currently defect blocks, with respect to the number of physical blocks in the spare area as the allowable capacity for memory defect. The life parameter processor 127 obtains a spare block use rate by formula (4) and stores this use rate into the byte number 2 of the physical page number 0 of the life parameter storing block 139:

$$\text{Spare block use rate} = P2/P1 \quad (4).$$

The spare block use rate is a parameter related to a ratio of the occurrence capacity for memory defect with respect to the allowable capacity for memory defect of the nonvolatile memory.

(3) Remaining Life Time Parameter

A third parameter represents estimated remaining time for the life of the nonvolatile memory device 110. The life parameter processor 127 obtains the remaining life time parameter by formula (5) below:

$$\text{Remaining life time parameter} = (P1-P2)/Vm \quad (5),$$

$$V_m = (v_1 + v_2 + \ldots + v_n)/n,$$

$$v_n = n/T_n.$$

Here, parameter $T_n$ is cumulative acting time from the time of shipment serving as a starting point until the number of defect blocks reaches n. Parameter $T_n$ is counted by the timer circuit built in the life parameter processor 127. Parameter $v_n$ is a speed until the number of defect blocks reaches n, namely, the number of occurring defect blocks per unit time (pcs/sec), and parameter $V_m$, is an occurrence average speed of the defect block.

Figure 9:
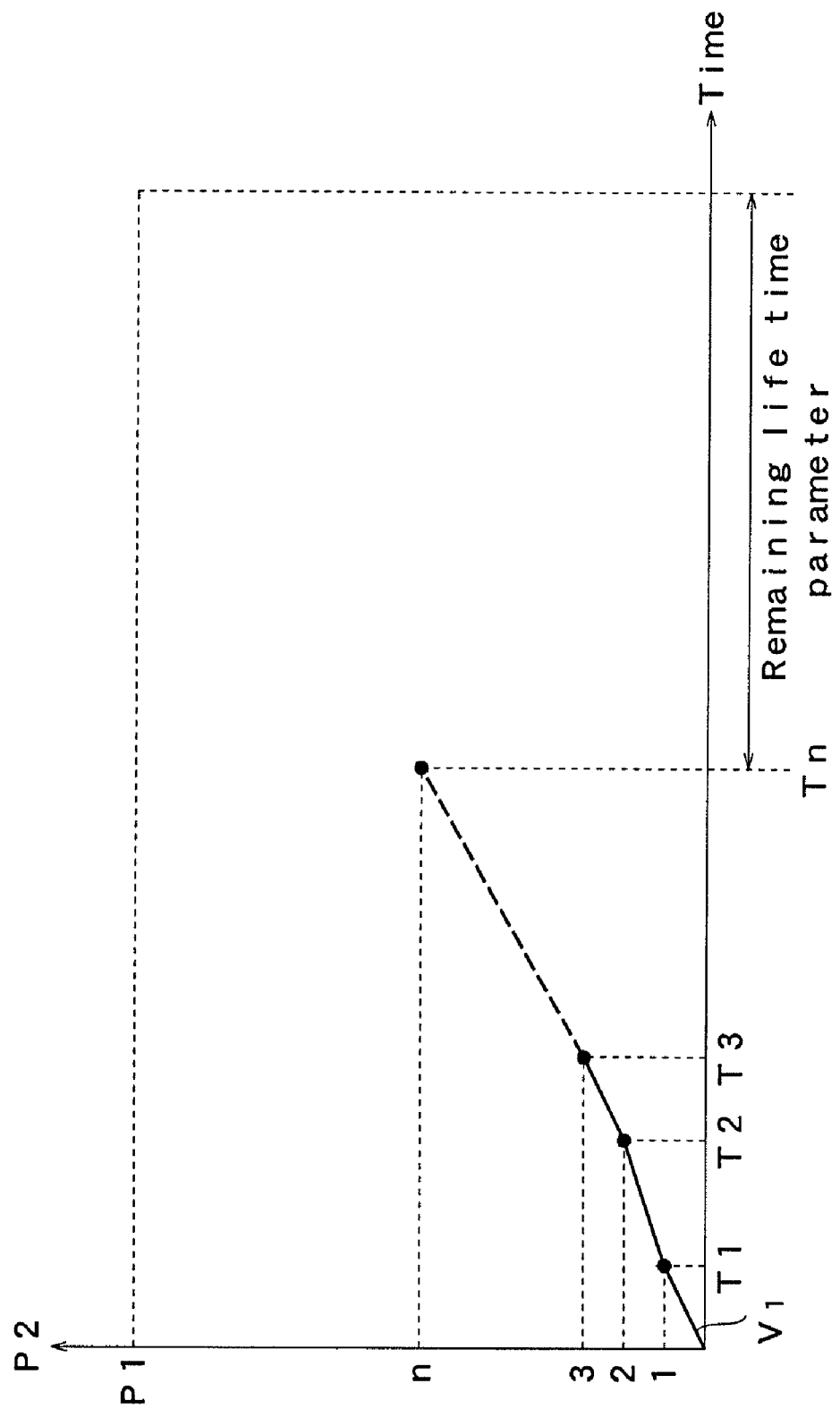
FIG. 9 is a graph showing a time shift of a parameter P2.

FIG. 9 shows an increase in the parameter P2 as time goes by and the speed calculated based on this. Assuming that the current number of defect blocks is n, time period until the number reaches to the parameter P1 at an average speed is the remaining life time parameter.

The life parameter processor 127 executes formula (5) as descried later when an error has occurred in data writing into the nonvolatile memory 130 and the defect block has been registered to the physical area management table. Each of the $v_1$ to $v_n$, $V_m$, and $T_n$ is stored in a partial area of the system area of the nonvolatile memory sequentially. The remaining life time parameter obtained in this manner is stored into the byte number 3 of the physical number 0 of the life parameter storing block 139.

(4) Alert Flag

A fourth parameter is an alert flag set by executing formula (6). Specifically, the life parameter processor 127 sets this flag when the aforementioned remaining life time parameter exceeds a threshold value, and stores it into a byte number 4 of the physical page number 0 of the life parameter storing block 139. Note that the alert flag is set at a value 0 in an initial state before the shipment.

Alert flag=1 (when remaining life time parameter<threshold value)

Alert flag=0 (when remaining life time parameter≧threshold value)     (6).

In this manner, a predetermined time before the life expires, for example, when it becomes less than a few hours, the alert flag is set.

(5) Defect Block Rate

A fifth parameter is a parameter indicating a rate of defect blocks. The life parameter processor 127 obtains a defect block rate by executing formula (7) below:

Defect block rate=P2/All number of physical blocks     (7).

This defect block rate is stored in the byte number 5 of the physical page number 0 of the life parameter storing block 139. The defect block rate is a parameter related to a ratio of the occurrence capacity for memory defect with respect to the overall capacity of the nonvolatile memory. When this defect block rate reaches 0.02, it means the life of this nonvolatile memory device has expired.

(6) Number of Spare Empty Blocks

In the memory defect, when there is a defect block in the nonvolatile memory 130, a block in the spare area 138 is used as an alternative block. Therefore, decrease in the number of empty blocks in the spare area 138 means reduction of the remaining capacity and means that the life is approaching with deterioration. Therefore, the number of empty blocks with respect to the remaining capacity of the spare area 138 with the memory defect can be a life parameter. For this, the number of empty blocks in the spare area 138 may be directly counted. Alternatively, the number can be calculated by formula (8) below using the number of spare blocks as P1 and the parameter P2 using the blocks in the spare area:

Number of spare empty blocks=P1−P2     (8).

When the number of spare empty blocks reaches 0, it means that the life of the nonvolatile memory device has expired.

[Data Writing Processing during Normal Operation]

Figure 10B:
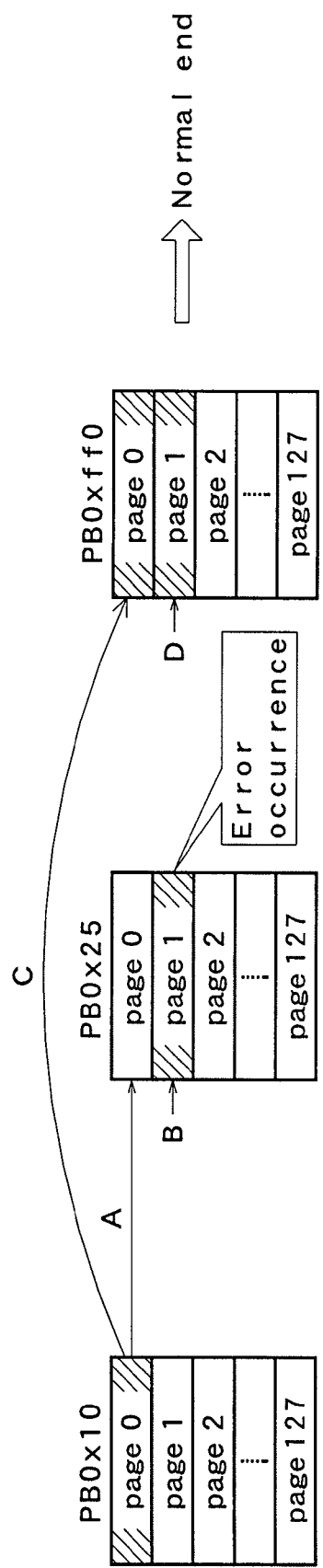
FIG. 10B is an explanation view showing a case an error occurred at data writing.

A description will be given concerning a case where the access device 100 writes data of 2 k bytes. Here, the description refers to a case, as an example, where data of 2 k bytes has already been written in the logical block number LBN=0, the data of 2 k bytes is to be written into the same logical block. FIG. 10A is an explanatory diagram illustrating a case where no writing error occurs, FIG. 10B is an explanatory diagram illustrating a case where a writing error occurs once, and FIG. 10C is an explanatory diagram illustrating a case where a writing error occurs twice.

In FIG. 10A, data of 2 k bytes is written in a page 0 of the physical block PB0x10. Thereafter, the access device 100 gives a command for writing subsequent data of 2 k bytes into the same logical block address LBN0. The nonvolatile memory device receives the data of 2 k bytes via the host interface 121, and stores it in the buffer 122. The CPU 124 refers to a physical address corresponding to the logical block number LBN0 in the logical-physical conversion table held therein. A physical block number (PBN=16) of the physical block PB0x10 is stored in this logical address, and the block status at a memory position of PBN=16 in the physical area management table is set at a value 00, namely, as a valid block.

The CPU 124 treats the physical block PB0x10 as an old block, acquires the physical block PB0x25, an erased block, as a new block based on the physical area management table, and then starts writing.

First, as shown by an arrow A in FIG. 10A, the data of 2 k bytes already stored in the page 0 of the physical block PB0x10 as an old block is evacuated to a page 0 of the physical block PB0x25. Next, the CPU 124 transfers, to the read and write controller 123, the data of 2 k bytes temporarily stored in the buffer 122 and a physical address corresponding to a page 1 of the physical block PB0x25, and newly writes data of 2 k bytes into the page 1 of the physical block PB0x25 via the register 131. An arrow B in FIG. 10A shows this writing. In the evacuation processing A and writing processing B, the CPU 124 receives a writing status from the nonvolatile memory 130, and normally ends when no error occurs.

FIGS. 10B and 10C show states in which the writing error occurs. FIG. 10B shows a case where writing finished normally through rewriting, and FIG. 10C shows a case where an error occurs in rewriting, further rewriting is given up and the error is reported to the access device 100. These processing will be described with referring to a flowchart of FIG. 11. For simplicity, a description of the evacuation processing will be omitted, focusing on rewriting only.

Figure 11:
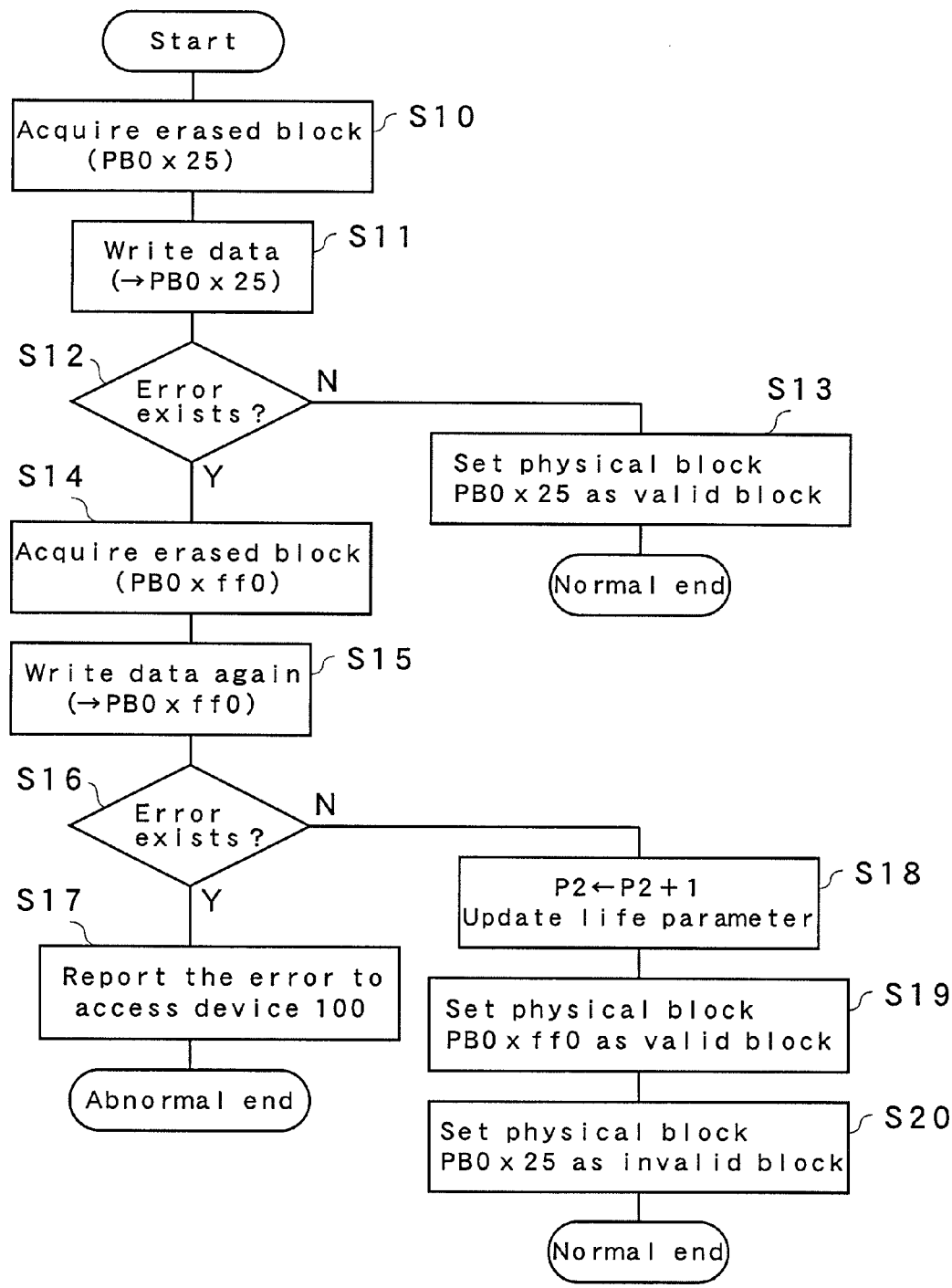
FIG. 11 is a flowchart showing data writing processing.

In FIG. 11, as described above, the CPU 124 acquires the erased physical block PB0x25 by referring to the physical area management table (S10), and writes the data of 2 k bytes into the page 1 of the physical block PB0x25 (S11). The CPU receives writing status from the nonvolatile memory 130 after the writing, and judges whether or not there is an error (S12). If there is no error, the CPU 124 sets the block status of the physical block PB0x25 in the physical area management table valid, namely, at a value 00, also registers the physical block number in the specified logical block address of the logical-physical conversion table, and then normally ends (S13). If there is an error, the CPU 124 acquires an erased physical block, for example, PB0xff0, in the spare area 138 by referring to the physical area management table (S14). Then in S15, the evacuated data is written into the page 0 of the physical block PB0xff0 (arrow C), and the data of 2 k bytes is written into the page 1 thereof (arrow D). The CPU receives writing status from the nonvolatile memory 130 after the writing, and judges whether or not there is an error (S16). If there is an error, the error is returned to the access device 100, resulting in abnormal ending. If there is no error, the parameter P2 is incremented and each life parameter is updated (S18). Next, the CPU 124 sets the block status of the physical block PB0xff0 in the physical area management table to be valid, namely, at a value 00, and also registers the physical block number in the corresponding logical address of the logical-physical conversion table (S19). Further, the CPU 124 sets the block status of the physical block PB0x25 in the physical area management table as a defect block, namely, at a value 10, and then normally ends (S20).

The processing of S18 will be described in detail. In S18, when the CPU 124 transfers a command for incrementing the parameter P2 to the life parameter generator 128, the parameter-2 calculator 126 reads the parameter P2 stored in the life parameter storing block 139 and increments this value by 1. Further, the life parameter processor 127 updates the second to fifth life parameters based on the incremented parameter P2, and writes back the life parameters and the parameter P2 to the life parameter storing block 139.

Next, the access device 100 gives to the nonvolatile memory device 110 a command for reading the life parameter in the life parameter storing block 139, and then the nonvolatile memory device 110 reads data in the life parameter storing block 139, and outputs the data to the access device 100 via the host interface. The access device 100 reads this data by the life parameter receiver 101. The display part 102 displays the transferred life parameter. The parameters P1 and P2, the spare block use rate, the estimated life time parameter, the alert flag, the defect block rate, and the number of spare empty blocks are used as the life parameter, and the access device 100 may display all of them or selectively display them. Moreover, these parameters may be processed and displayed in the access device 100 side. In addition, the access device 100 may refer to the life parameter in the life parameter storing block at arbitrary timing, for example, at the time of initialization after the power is turned on, or periodically.

Moreover, when the access device 100 side previously knows information corresponding to the parameter P1, namely, information related to the allowable capacity for memory defect of the nonvolatile memory device 110, the access device 100 can recognize the life of the nonvolatile memory device 110 by referring to only the parameter P2 each time. In such a case, for example, defining an occurrence rate of defect blocks as 2% as specifications and recognizing the capacity (for example, 1G bytes) of the nonvolatile memory device 110 at the time of initialization permits the access device 100 side to calculate each life parameter based on these pieces of information. Displaying the life parameter by the access device 100 permits the user to accurately recognize the life of the nonvolatile memory 130.

Finally, referring to FIG. 12, the outer appearance of the nonvolatile memory device 110 will be described. In FIG. 12, 200 denotes a housing of the nonvolatile memory device 110, and 201 denotes a seal attached to the housing 200. For the nonvolatile memory device 110 with a relatively long life, "Long Life" is indicated on the seal 201, and for the device with a short life, "Short Life" is indicated thereon. This permits the user to roughly estimate the approximate life before purchase of the nonvolatile memory device 110 even without using the nonvolatile memory device 110 fitted to the access device 100. Moreover, by changing a color of the housing 200 or changing a shape thereof, it may be determined whether the life of the nonvolatile memory device 110 is long or short. The semiconductor memory vendor side may extract flash memories of each lot as samples and then measure the lives thereof to thereby determine whether to display "Long Life" or "Short Life".

For the nonvolatile memory device 110 with "Short Life" indicated thereon, it is also possible to use a nonvolatile memory which failed in a rewriting guarantee test on the flash memory vendor side, namely, whose guaranteed number of times of rewriting is less than 10,000. Such a low-quality nonvolatile memory is low-cost, and thus the price of the nonvolatile memory device 110 can also be set low. This is convenient for a user who uses it for applications, such as music reproduction, which do not involve frequent rewriting, so that the user can select and purchase the nonvolatile memory device 110 as usage.

For the life parameter storing block 139, a nonvolatile memory may be provided in the memory controller 120 so that the life parameter storing block 139 may be stored therein. Moreover, the nonvolatile memory 130 may be a nonvolatile memory other than a flash memory, for example, a nonvolatile RAM such as a variable-resistance-type memory. Moreover, the parameters P1 and P2 are parameters in units of the number of physical blocks but may be parameters in any units, such as number of pages or number of bytes, as long as they relate to the memory capacity. Moreover, the display part 102 may not be a special display circuit for displaying only the life parameters. It may be displayed on an LCD monitor provided as standard equipment as in a digital still camera for example. In addition, on a surface of the nonvolatile memory device, an electronic paper disclosed in, for example, Japanese Unexamined Patent Publication No. 2005-267188 may be provided, and each of the life parameters processed by the life parameter processor or part of the life parameters may be displayed on this electronic paper.

INDUSTRIAL APPLICABILITY

The nonvolatile memory system according to the present invention suggests a method which permits judgment of the life of the nonvolatile memory device, and is useful in various nonvolatile memory devices such as a semiconductor memory card, and in a still image recording reproduction device and a moving image recording reproduction device or a mobile phone using this.

The invention claimed is:

1. A nonvolatile memory device which reads and writes data in accordance with commands for an access from outside, comprising:
    a nonvolatile memory;
    a life parameter generator for calculating an occurrence speed for memory defect of said nonvolatile memory device and estimating an estimated remaining time for a life of said nonvolatile memory device based on an allowable capacity for memory defect of said nonvolatile memory device and said occurrence speed for memory defect; and
    a life parameter output part for outputting said life parameter to the outside.

2. A nonvolatile memory system including an access device and a nonvolatile memory device which reads and writes data in accordance with commands for an access from said access device,
    wherein said nonvolatile memory device comprises:
    a nonvolatile memory;
    a life parameter generator for calculating an occurrence speed for memory defect of said nonvolatile memory device and estimating an estimated remaining time for a life of said nonvolatile memory device based on an allowable capacity for memory defect of said nonvolatile memory device and said occurrence speed for memory defect; and
    a life parameter output part for outputting said life parameter to the outside, and
    wherein said access device comprises:
    a life parameter receiver for receiving parameters from said life nonvolatile memory device; and
    a display part for displaying the life parameter received by said life parameter receiver.

3. A defect management method for a nonvolatile memory device having a nonvolatile memory comprising steps of:
    calculating an occurrence speed for memory defect of said nonvolatile memory device;
    estimating an estimated remaining time for a life of said nonvolatile memory device based on an allowable capacity for memory defect of said nonvolatile memory device and said occurrence speed for memory defect; and
    further indicating said estimated remaining time.

* * * * *